United States Patent
Flax et al.

(10) Patent No.: US 10,884,072 B2
(45) Date of Patent: Jan. 5, 2021

(54) METHOD AND APPARATUS FOR DETERMINING RESISTANCES IN MULTIPHASE TRANSFORMER USING MULTIPLE INJECTED CURRENTS IN RESPECTIVE WINDINGS

(71) Applicant: Omicron electronics GmbH, Klaus (AT)

(72) Inventors: Dirk Flax, Dornbirn (AT); René Sapetschnig, Bregenz (AT)

(73) Assignee: Omicron electronics GmbH, Klaus (AT)

( * ) Notice: Subject to any disclaimer, the term of this patent is extended or adjusted under 35 U.S.C. 154(b) by 71 days.

(21) Appl. No.: 16/303,352

(22) PCT Filed: May 24, 2017

(86) PCT No.: PCT/EP2017/062569
§ 371 (c)(1),
(2) Date: Nov. 20, 2018

(87) PCT Pub. No.: WO2017/202927
PCT Pub. Date: Nov. 30, 2017

(65) Prior Publication Data
US 2020/0025817 A1   Jan. 23, 2020

(30) Foreign Application Priority Data

May 25, 2016   (AT) .................................. 50478/2016

(51) Int. Cl.
*G01R 31/62*  (2020.01)
*G01R 27/08*  (2006.01)
*G01R 31/72*  (2020.01)

(52) U.S. Cl.
CPC ............. *G01R 31/62* (2020.01); *G01R 27/08* (2013.01); *G01R 31/72* (2020.01)

(58) Field of Classification Search
CPC ......... G01R 27/08; G01R 31/72; G01R 31/62
See application file for complete search history.

(56) References Cited

U.S. PATENT DOCUMENTS

| 5,276,402 A | 1/1994 | Schucht |
| 7,106,078 B1 | 9/2006 | Frank et al. |

(Continued)

FOREIGN PATENT DOCUMENTS

| CN | 102759662 | 10/2012 |
| CN | 202886475 | 4/2013 |

(Continued)

OTHER PUBLICATIONS

International Search Report, counterpart International Appl. No. PCT/EP2017/062569, pp. 6 (dated Aug. 18, 2017) (with partial translation).

(Continued)

*Primary Examiner* — Jay Patidar
(74) *Attorney, Agent, or Firm* — Cook Alex Ltd.

(57) ABSTRACT

A method (60) for determining resistances ($R_1$, $R_2$, $R_3$, $R_N$) on a voltage level of a multiphase transformer (10) comprising one winding (u, v, w; U, V, W) for each phase comprises injecting a particular first current into the particular winding (u, v, w; U, V, W); recording a particular first voltage caused by the injected first currents in the plurality of phases; injecting a particular second current into the particular winding (u, v, w; U, V, W), wherein the particular injected second current differs from the particular injected first current in at least one of the plurality of phases; recording a particular second voltage caused by the injected second currents in the plurality of phases, and determining the resistances ($R_1$, $R_2$, $R_3$, $R_N$) on the voltage level on the basis of the injected first and second currents and the recorded first and second voltages. An apparatus (70) for (Continued)

determining resistances ($R_1$, $R_2$, $R_3$, $R_N$) on a voltage level of a multiphase transformer (10) is also proposed.

14 Claims, 5 Drawing Sheets

(56) References Cited

U.S. PATENT DOCUMENTS

2014/0191774 A1\* 7/2014 Muller .................. G01R 31/72
  324/713
2017/0089854 A1\* 3/2017 Bonavides ................ G01F 1/74

FOREIGN PATENT DOCUMENTS

| CN | 104849556 | 8/2015 |
|----|-----------|--------|
| EP | 2710389 B1 | 7/2015 |
| WO | WO 2015/183238 | 12/2015 |

OTHER PUBLICATIONS

International Written Opinion Report, counterpart International Appl. No. PCT/EP2016/066100, pp. 8 (dated Aug. 18, 2017) (without translation).
Search Report, counterpart Austrian application No. 50478/2016, 1 page (dated Apr. 20, 2017).

\* cited by examiner

METHOD AND APPARATUS FOR DETERMINING RESISTANCES IN MULTIPHASE TRANSFORMER USING MULTIPLE INJECTED CURRENTS IN RESPECTIVE WINDINGS

The present application is a U.S. National Stage of PCT International Patent Application No. PCT/EP2017/062569, filed May 24, 2017, which claims priority to Austrian Application No. A 50478/2016, filed May 25, 2016, both of which are hereby incorporated herein by reference.

FIELD OF THE INVENTION

The present invention relates to methods and apparatuses for determining resistances in multiphase transformers, in particular multiphase power transformers for use as resources in electrical energy supply networks.

BACKGROUND OF THE INVENTION

Transformers, in particular power transformers, are used in electrical energy supply networks as resources for the transmission of electrical power between voltage levels. In fault-free operation, only very low power losses occur, which are converted into heat.

Increased power losses due to faults can lead to the release of heat, however, which can sometimes destroy the transformer concerned and lead to operational malfunctions.

Safeguarding the operation against such disruptions requires a proactive fault detection procedure. This can involve, for example, determining electrical resistances, in particular winding resistances, in a transformer to be protected. In order, for example, to measure a resistance of a particular winding, a current is injected into its terminals and the resulting voltage between the terminals is detected. The resistance to be measured can then be determined using Ohm's law.

This allows, for example, winding faults to be identified, which are reflected in modified resistance values and therefore lead to higher power losses and increased heat release. Examples of such winding faults are inter-turn short circuits, in other words the bridging of turns within one winding, and also winding discontinuities.

Particularly in the case of multiphase transformers, the determination of the resistances takes a considerable amount of time. This involves components for stabilizing the injected current, for detecting the resulting voltage, for shifting an existing load level switch that may be present up to a next level, and for discharging the transformer. This time expenditure is repeated for all levels of the load level switch and for each one of the plurality of phases.

SUMMARY OF THE INVENTION

The object of the present invention therefore is to provide improved methods and correspondingly designed apparatuses which can be used to reduce the time required to determine the resistances of multiphase transformers.

This object is achieved according to the invention by a method according to claim 1 and an apparatus according to claim 9. The dependent claims define preferred and advantageous embodiments of the invention.

Such methods and devices shorten the time required to determine the resistances of multiphase transformers by the simultaneous determination of a plurality of resistances. In addition, it can also be used to determine a potentially existing feed-through resistance of a neutral conductor in a star connection.

A method for determining resistances in a voltage level of a multiphase transformer, wherein a voltage level has one winding for each phase of the multiphase transformer, comprises according to one exemplary embodiment: injecting a respective first current into each winding of the plurality of phases; detecting a respective first voltage induced in the plurality of phases by the first injected currents; injecting a respective second current into the respective winding of the plurality of phases, wherein the respective second injected current is different from the respective first injected current in at least one of the plurality of phases; detecting a respective second voltage induced in the plurality of phases by the injected second currents, and determining the resistances in the voltage level as a function of the first and second injected currents and the first and second detected voltages.

A voltage level is understood to mean in particular a high-voltage side or a low-voltage side of the transformer. The plurality of phases comprise in particular three phases (three-phase current). The resistors are in particular ohmic resistances, and the currents or voltages are in particular DC currents or DC voltages respectively. In principle, the method also works for alternating currents and alternating voltages, but this requires a transition to complex impedances in order to take into account phase angles.

The determination of the resistances in the voltage level can comprise solving a system of equations which is based on a network analysis of the voltage level in the injected first and second currents of the plurality of phases.

Network analysis is understood to mean a description of a relationship between electrical currents and voltages in electrical networks using Kirchhoff's laws (nodal rule, loop rule) and solving the relation for particular variables of interest.

The detecting of the respective voltage induced by the injected currents in the plurality of phases can comprise detection of the respective voltage induced between respective first and second terminals of the respective winding in the plurality of phases.

The voltage level can comprise a star connection of the plurality of windings, wherein the first terminals of the plurality of windings are connected to a neutral conductor.

The voltage level can comprise a star connection of the plurality of windings, wherein the first terminals of the plurality of windings are connected to a neutral conductor via a feed-through resistance.

The determined resistances can comprise the feed-through resistance.

The voltage level can comprise a delta connection of the plurality of windings.

In particular, in a delta connection each one of the first terminals is connected to one of the second terminals, such that a closed series connection of the windings of the plurality of phases is obtained.

The determined resistance can comprise the resistances of the plurality of windings.

An apparatus for determining resistances in a voltage level of a multiphase transformer, which has one winding per phase of the multiphase transformer, comprises according to one exemplary embodiment: a power source, which is configured for injecting a respective first and second current into the respective winding of the plurality of phases, wherein the respective second injected current is different from the respective first injected current in at least one of the plurality of phases, a detecting device which is configured to detect a respective first or second voltage induced by the first or second injected currents in the plurality of phases, and a determining device which is configured to determine the resistances in the voltage level as a function of the injected first and second currents and the detected first and second voltages.

The determining device may be a computer system.

The apparatus may also comprise a control device, which is designed for determining the resistances fully automatically.

Advantageously, the fully automatic determination of the resistances provides a means of shortening the time taken to determine the resistances of multiphase transformers.

The determining device can comprise the control device.

Advantageously, this can reduce the number of components and can support miniaturization of the device.

The control device can be designed to automatically control the power source and the control device.

Advantageously, by the elimination of manual operations and the corresponding possibilities for error, the time required to determine the resistances of multiphase transformers can be further reduced.

The device can be designed to be portable.

Advantageously, the portable design enables the resistances to be determined at the location in which the multiphase transformer is used.

BRIEF DESCRIPTION OF THE FIGURES

The invention is explained in more detail below based on preferred embodiments and with reference to the drawings, wherein identical reference numerals designate the same or similar elements.

DETAILED DESCRIPTION OF EXEMPLARY EMBODIMENTS

Hereafter, the invention is described in greater detail based on preferred embodiments and with reference to the drawings.

The figures are schematic representations of different embodiments of the invention. Elements shown in the figures are not necessarily represented true to scale, but rather reproduced in such a way that their function and purpose are understandable to the person skilled in the art.

Figure 1:
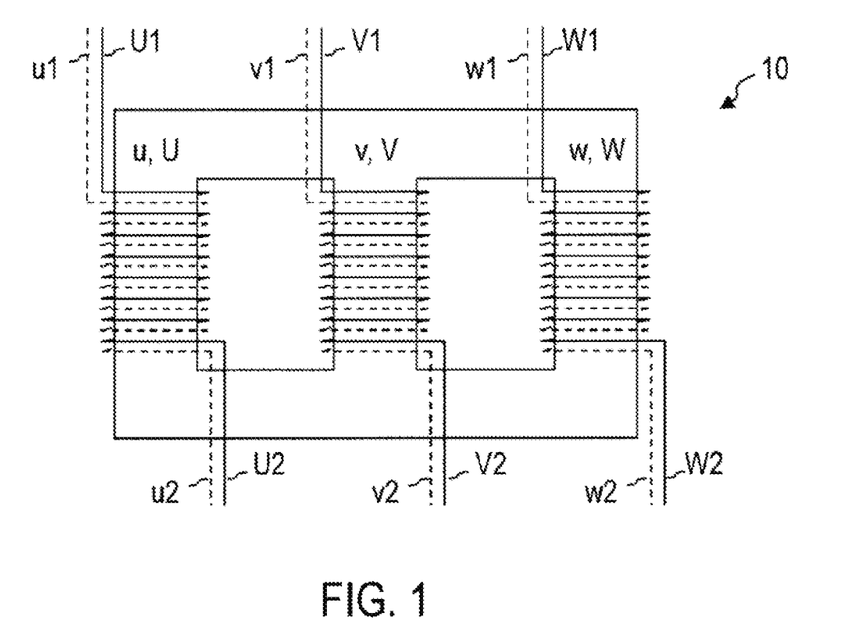
FIG. 1 shows a schematic view of a multiphase transformer in accordance with an exemplary embodiment.

FIG. 1 shows a schematic view of a multiphase transformer 10 in accordance with an exemplary embodiment.

The multi-phase transformer 10 has a three-element design, which means three phases and two voltage levels. Each of the three elements comprises one winding u, v, w of a low-voltage side as well as one winding U, V, W of a high-voltage side. The windings u, v, w of the low-voltage side have first and second terminals $u_1$, $u_2$, $v_1$, $v_2$, $w_1$, $w_2$, whereas the windings U, V, W of the high-voltage side have first and second connections $U_1$, $U_2$, $V_1$, $V_2$, $W_1$, $W_2$.

Figure 2:
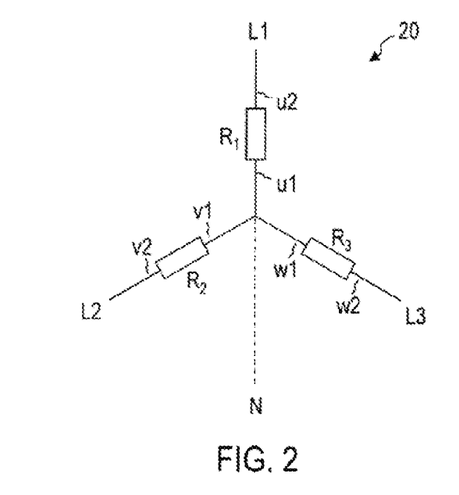
FIG. 2 shows a schematic view of a multiphase transformer in accordance with a first exemplary embodiment.

FIG. 2 shows a schematic view of a star connection 20 in accordance with a first exemplary embodiment.

The underlying multiphase transformer 10 has three phases.

Without limitation of generality, in the exemplary embodiment the first connections $u_1$, $v_1$, $w_1$ of the windings u, v, w of the low-voltage side are connected to each other at a neutral point. The neutral point is connected to a neutral conductor N, and the second terminals $u_2$, $v_2$, $w_2$ of the windings u, v, w of the low-voltage are connected to phase conductors $L_1$, $L_2$, $L_3$.

The neutral conductor terminal is shown in dashed lines, because it is not absolutely necessary in the case of a symmetrical load.

The winding resistances $R_1$, $R_2$, $R_3$ provided on the low-voltage side shown in FIG. 2 can be determined with methods and apparatuses according to the invention. A comparable statement applies to correspondingly interconnected high-voltage sides.

Figure 3:
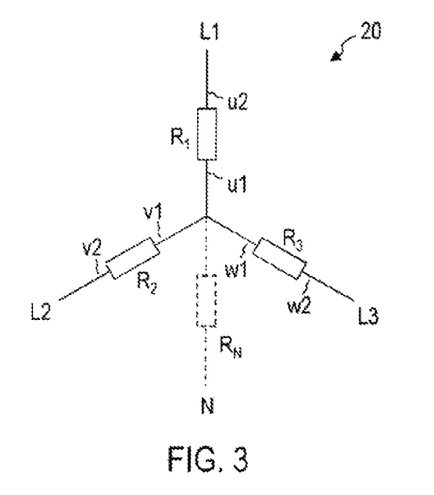
FIG. 3 shows a schematic view of a multiphase transformer in accordance with a second exemplary embodiment.

FIG. 3 shows a schematic representation of a star connection 20 in accordance with a second exemplary embodiment.

In contrast to the otherwise identical representation in FIG. 2, the connection of the neutral point to the neutral conductor N has a feed-through resistance $R_N$, which can result in power losses and corresponding heat production.

Using methods and apparatuses according to the invention, both the winding resistances $R_1$, $R_2$, $R_3$ and the feed-through resistance $R_N$ can be determined. The same applies to correspondingly interconnected high-voltage sides.

Figure 4:
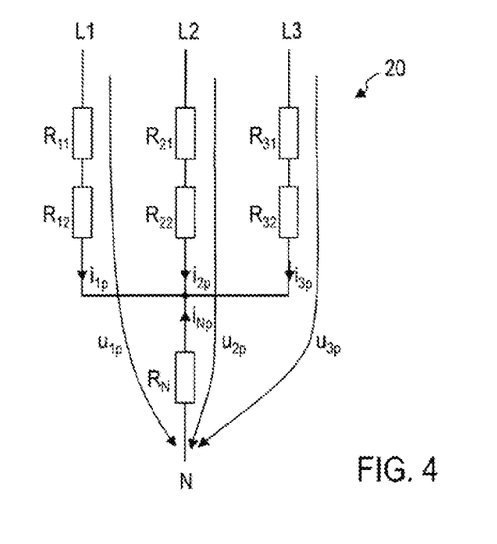
FIG. 4 shows a schematic view of a star connection in accordance with a third exemplary embodiment.

FIG. 4 shows a schematic view of a star connection 20 in accordance with a third exemplary embodiment.

In the exemplary embodiment the feed-through resistance $R_N$ of the neutral conductor N is a fixed value. In contrast to FIG. 3, in each of the three phase conductors $L_1$, $L_2$, $L_3$ a respective feed-through resistance $R_{11}$, $R_{21}$, $R_{31}$ is also taken into account in addition to the winding resistance $R_{12}$, $R_{21}$, $R_{31}$. With the method according to the invention, for each one of the three phase conductors $L_1$, $L_2$, $L_3$ the respective sum $R_1$, $R_2$, $R_3$ can be determined from the feed-through resistance $R_{11}$, $R_{21}$, $R_{31}$ and winding resistance $R_{12}$, $R_{22}$, $R_{32}$, as shown in the following on the basis of an example calculation.

In accordance with Kirchhoff's first law (nodal rule), at the point where the three phase conductors $L_1$, $L_2$, $L_3$ meet the sum of the currents is zero:

$$i_{1p}+i_{2p}+i_{3p}+i_{Np}=0 \text{ with } p\in\{1;2\}$$

The index p denotes whether the first (p=1) or second (p=2) currents (hereafter and/or voltages) are being referred to. The neutral conductor N always sinks the sum $i_{Np}$ of the injected currents $i_{1p}$, $i_{2p}$, $i_{3p}$. Even without measuring the currents $i_{Np}$ in the neutral conductor N, all currents are therefore known.

From Kirchhoff's second law (loop rule) and Ohm's law, the phase voltages $u_{1p}$, $u_{2p}$, $u_{3p}$ of the three phase conductors $L_1$, $L_2$, $L_3$ are given by:

$$u_{1p}=i_{1p}\cdot R_1-i_{Np}\cdot R_N \quad \text{(I)}$$

$$u_{2p}=i_{2p}\cdot R_2-i_{Np}\cdot R_N \quad \text{(II)}$$

$$u_{3p}=i_{3p}\cdot R_3-i_{Np}\cdot R_N \text{ with } p\in\{1;2\} \quad \text{(III)},$$

Substituting the values of p results in three equation systems each with two equations and two unknowns, which can be solved separately:

$$i_{11} \cdot R_1 - i_{N1} \cdot R_N = u_{11} \quad (I')$$

$$i_{12} \cdot R_1 - i_{N2} \cdot R_N = u_{12} \quad (I'')$$

$$i_{21} \cdot R_2 - i_{N1} \cdot R_N = u_{21} \quad (II')$$

$$i_{22} \cdot R_2 - i_{N2} \cdot R_N = u_{22} \quad (II'')$$

$$i_{31} \cdot R_3 - i_{N1} \cdot R_N = u_{31} \quad (III')$$

$$i_{32} \cdot R_3 - i_{N2} \cdot R_N = u_{32} \quad (III'')$$

Below, examples of the two equations are scaled and added such that in each case the feed-through resistance $R_N$ of the neutral conductor N is cancelled out and one of the resistances to be determined $R_1$, $R_2$, $R_3$ is obtained:

$$R_1 = [u_{11} + i_{N1}/(-i_{N2}) \cdot u_{12}]/[i_{11} + i_{N1}/(-i_{N2}) \cdot i_{12}] \text{ from } (I') + i_{N1}/(-i_{N2}) \cdot (I'')$$

$$R_2 = [u_{21} + i_{N1}/(-i_{N2}) \cdot u_{22}]/[i_{21} + i_{N1}/(-i_{N2}) \cdot i_{22}] \text{ from } (II') + i_{N1}/(-i_{N2}) \cdot (II'')$$

$$R_3 = [u_{31} + i_{N1}/(-i_{N2}) \cdot u_{32}]/[i_{31} + i_{N1}/(-i_{N2}) \cdot i_{32}] \text{ from } (III') + i_{N1}/(-i_{N2}) \cdot (III'')$$

The feed-through resistance $R_N$ of the neutral conductor N, which is also sought, is given by any equation of the three equation systems by substitution:

$$R_N = \{u_{11} - i_{11} \cdot R_1\}/(-i_{N1}) = \text{from } (I') =$$

$$\{u_{11} - i_{11} \cdot [u_{11} + i_{N1}/(-i_{N2}) \cdot u_{12}]/[i_{11} + i_{N1}/(-i_{N2}) \cdot i_{12}]\}/(-i_{N1})$$

Thus, all the resistances $R_1$, $R_2$, $R_3$, $R_N$ in the voltage level are determined as a function of the injected first and second currents $i_{1p}$, $i_{2p}$, $i_{3p}$, $i_{Np}$ and the measured first and second voltages $u_{1p}$, $u_{2p}$, $u_{3p}$, wherein $p \in \{1; 2\}$.

Even small differences between the injected currents are sufficient to produce soluble equations, such as:

$$i_{11} = +I, \; i_{21} = +I, \; i_{31} = -I, \text{ and}$$

$$i_{12} = +I, \; i_{22} = +I, \; i_{32} = -0.9 \cdot I,$$

where I is a current with a defined magnitude in Amperes.

Figure 5:
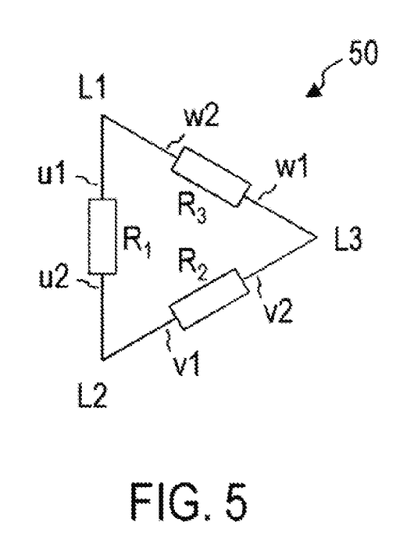
FIG. 5 shows a schematic view of a delta connection in accordance with an exemplary embodiment.

FIG. 5 shows a schematic view of a delta connection 50 in accordance with an exemplary embodiment.

Such a circuit configuration can exist, for example, in a multiphase transformer 10 with three phases.

Again, without loss of generality the low-voltage side is illustrated. Pairs of terminals $u_1$-$w_2$, $v_1$-$u_2$ and $w_1$-$v_2$ of the windings u, v, w of the low-voltage side link the windings u, v, w together to form a closed series circuit. The junctions of the pairs of terminals $u_1$-$w_2$, $v_1$-$u_2$ and $w_1$-$v_2$ of the windings u, v, w are connected to phase conductors $L_1$, $L_2$, $L_3$.

Also on the voltage level shown in FIG. 5, the winding resistances $R_1$, $R_2$, $R_3$ are amenable to a determination procedure in a similar manner as previously shown for FIG. 4. The equivalent applies to high-voltage sides interconnected in the corresponding way.

Figure 6:
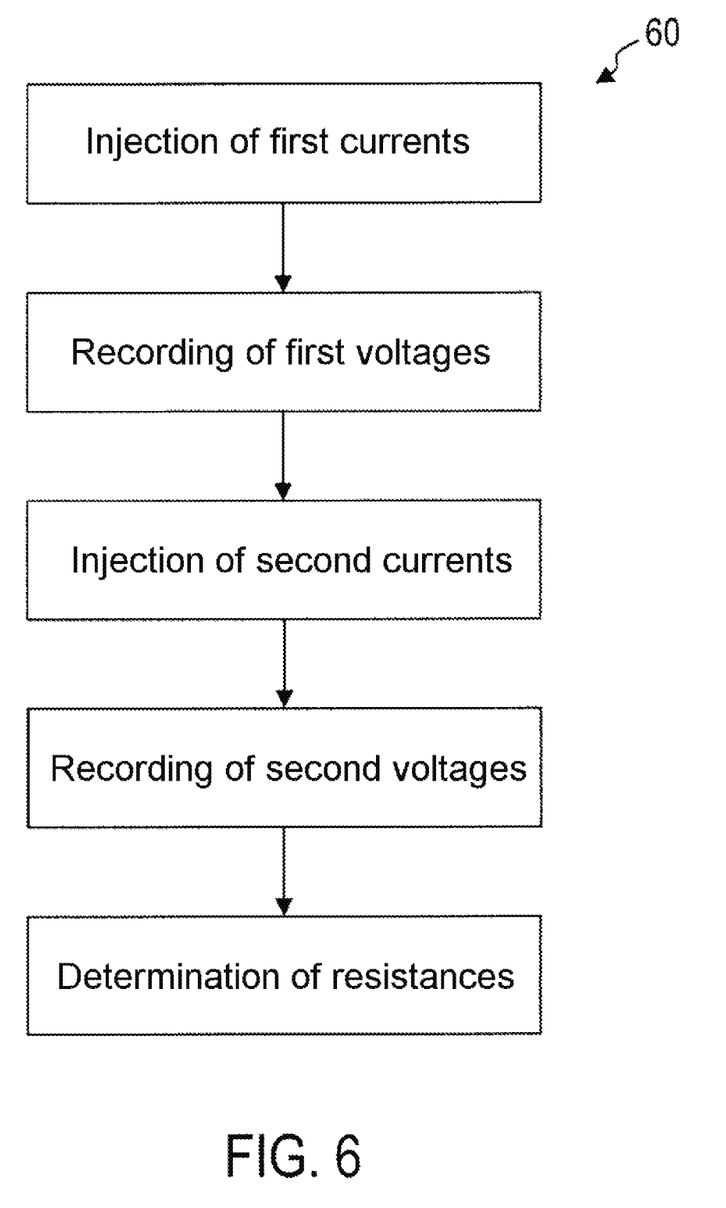
FIG. 6 shows a flow diagram of a method in accordance with one embodiment.

FIG. 6 shows a flow diagram of a method 60 in accordance with one embodiment.

The method relates to a voltage level of the multiphase transformer 10, thus either to the low-voltage side or the high-voltage side of the same, which comprises one winding per phase.

In a first step, first currents are injected into the windings of the voltage level. To achieve this, a previously provided user input for the first currents is compared with a user input for standardized maximum currents, also previously provided, and used as a target value for sequentially increasing the first injected currents up to the target value. In the case of a star connection without a neutral conductor terminal of the neutral point and in the case of a delta connection, there are two currents to be provided compared to the three terminals $L_1$, $L_2$, $L_3$. In the case of a star connection with neutral conductor connection of the neutral point, on the other hand, three currents must be injected into the four terminals $L_1$, $L_2$, $L_3$, N.

The target value is reached and the first step has been completed when a stability criterion is satisfied.

In a second step, first voltages induced in the plurality of phases of the voltage level by the first injected currents are detected or recorded. To this end, the induced voltages are measured between the respective first and second terminals of the respective winding in the plurality of phases. In particular, this is performed simultaneously. In a star connection without a neutral conductor terminal of the neutral point and in a delta connection, these are the voltages between the terminal pairs $L_1$-$L_2$, $L_2$-$L_3$ and $L_3$-$L_1$. In a star connection with neutral conductor connection of the neutral point, the voltages are measured between the terminal pairs $L_1$-N, $L_2$-N and $L_3$-N.

In a third step, second currents are injected into the windings of the voltage level. For the number of currents to be injected, reference is made to the previous remarks concerning the first step. At least one of the second currents to be injected must be different to its corresponding injected first current, however.

In a fourth step, second voltages induced in the plurality of phases of the voltage level by the second injected currents are detected or recorded. The second voltages are measured between the same terminals at the same time, as has already been described for the second step. At the end of the fourth step the injected second currents are sequentially reduced down to the target value of zero.

In a fifth step, the resistances in the voltage level are determined as a function of the injected first and second currents and the detected first and second voltages. Each of the two previously described detecting or recording steps contributes a set of equations for this purpose, each of which is based on a network analysis of the voltage level for the injected first or second currents. The equations are based on Kirchhoff's nodal and loop rules, in which each of the injected currents are related to each of the detected voltages according to the resistances to be determined and the circuit topology of the voltage level. The resistances in the voltage level can therefore be determined by solving the system of equations using known methods. The resistances determinable in this way include, quite generally, the winding resistances $R_1$, $R_2$, $R_3$. In a star connection with feed-through resistance $R_N$ from the neutral point to the neutral conductor N, the feed-through resistance $R_N$ can also be determined.

If the transformer has load level switches, then the method can be repeated for each load level of each one of the load level switches.

Figure 7:
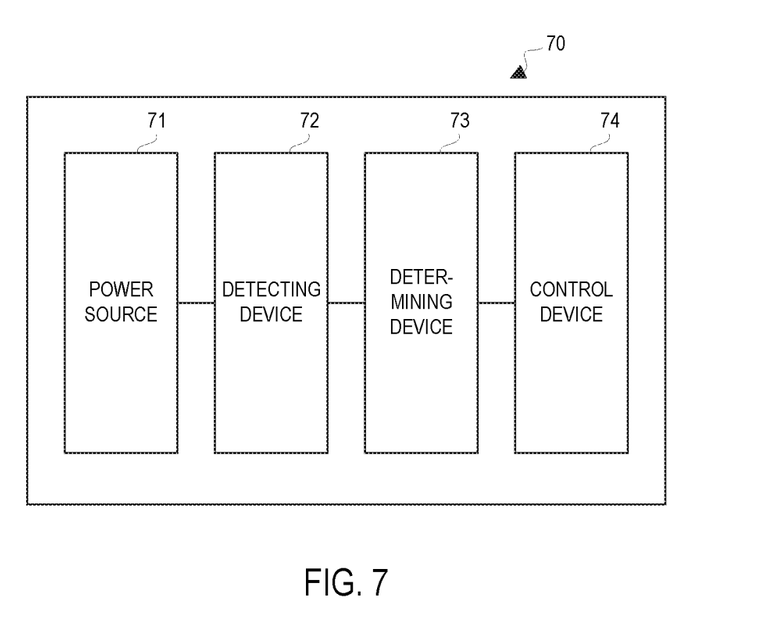
FIG. 7 shows a schematic block circuit diagram of an apparatus according to a first embodiment.

FIG. 7 shows a schematic block diagram of an apparatus 70 according to a first embodiment.

The apparatus 70 also refers to one voltage level of the multiphase transformer 10. It comprises a power source 71, a detecting device 72 and a determining device 73.

The power source 71 is used to inject the first or second currents into the respective windings u, v, w or U, V, W, according to whether the voltage level is a low-voltage side or a high-voltage side of the transformer. According to the above remarks the injected first and second currents must differ from one another, at least in terms of one current, in order to provide two mutually independent sets of equations.

The detecting device 72 is configured to detect the respective first or second voltage induced between previously described terminal pairs by the injected first or second currents.

The determining device 73 is designed to determine the up to four resistances $R_1$, $R_2$, $R_3$, $R_N$ in the voltage level as a function of the injected first and second currents and of the detected first and second voltages. It can be a computer system which can execute machine-readable instructions.

The device 70 shown in FIG. 7 also comprises a control device 74, which is designed for the fully automatic implementation of the method 60 by controlling the power source 71, the detecting device 72 and the determining device 73 in accordance with the sequence of the method 60 after the provision of the required electrical contacts between the apparatus 70 and the up to four terminals $L_1$, $L_2$, $L_3$, N of the multi-phase transformer.

Figure 8:
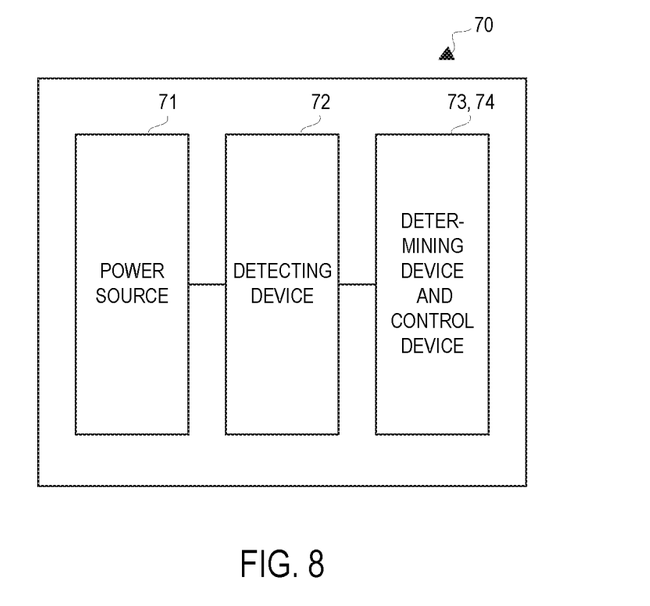
FIG. 8 shows a schematic block diagram of an apparatus according to a second embodiment.

FIG. 8 shows a schematic block diagram of an apparatus 70 according to a second embodiment.

According to this design, the determining device 73 and the control device 74 are integrated. With regard to other aspects of the design and the operation of the apparatus 70 of FIG. 8, in order to avoid repetition these can be found by reference to the preceding remarks in relation to FIG. 7.

In addition, the apparatuses 70 of FIG. 7-8 can be designed in portable form.

REFERENCE NUMERALS 10 multiphase transformer
20 star connection
50 delta connection
60 method
70 apparatus
71 power source
72 detecting device
73 determining device
74 control device
u, v, w windings of the plurality of phases of the low-voltage side of the multiphase transformer
$u_1$, $v_1$, $w_1$ first terminals of the same
$u_2$, $v_2$, $w_2$ second terminals of the same
U, V, W windings of the plurality of phases of the high-voltage side of the multiphase transformer
$U_1$, $V_1$, $W_1$ first terminals of the same
$U_2$, $V_2$, $W_2$ second terminals of the same
$L_1$, $L_2$, $L_3$ phase conductors
N neutral conductor
$R_1$, $R_2$, $R_3$ winding resistances
$R_N$ feed-through resistance

The invention claimed is:

1. A method for determining resistances in a voltage level of a multiphase transformer, wherein the voltage level has one winding for each of a plurality of phases of the multiphase transformer, comprising the steps:

injecting a respective first current into the respective winding of the plurality of phases, detecting a respective first voltage induced in the plurality of phases by the first injected currents, injecting a respective second current into the respective winding of the plurality of phases, wherein the respective second injected current is different from the respective first injected current in at least one of the plurality of phases, detecting a respective second voltage induced in the plurality of phases by the injected second currents, and determining the resistances in the voltage level as a function of the first and second injected currents and the first and second detected voltages.

2. The method as claimed in claim 1, wherein the determination of the resistances in the voltage level comprises solving equations based on a network analysis of the voltage level in the injected first and second currents of the plurality of phases.

3. The method as claimed in claim 1, wherein the detecting of the respective voltage caused by the injected currents in the plurality of phases comprises detecting the respective voltage induced between respective first and second terminals of the respective winding in the plurality of phases.

4. The method as claimed in claim 3, wherein the voltage level comprises a star connection of the plurality of windings, wherein the first terminals of the plurality of windings are connected to a neutral conductor.

5. The method as claimed in claim 3, wherein the voltage level comprises a star connection of the plurality of windings, wherein the first terminals of the plurality of windings are connected via a feed-through resistance to a neutral conductor.

6. The method as claimed in claim 5, wherein the determined resistances comprise the feed-through resistance.

7. The method as claimed in claim 3, wherein the voltage level comprises a delta connection of the plurality of windings.

8. The method as claimed in claim 1, wherein the determined resistances comprise the resistances of the plurality of windings.

9. An apparatus for determining resistances in a voltage level of a multiphase transformer, wherein the voltage level has one winding for each of a plurality of phases of the multiphase transformer, comprising:

a power source, which is configured for injecting a respective first and second current into the respective winding of the plurality of phases, wherein the respective second injected current is different from the respective first injected current in at least one of the plurality of phases, a detecting device which is configured to detect a first voltage and a second voltage, respectively, induced in the plurality of phases by the first injected current and the second injected current, respectively, and a determining device which is configured to determine the resistances the voltage level as a function of the injected first and second currents and the detected first and second voltages.

10. The apparatus as claimed in claim 9, wherein the determining device is a computer system.

11. The apparatus as claimed in claim 9, further comprising a control device, which is designed to determine the resistances automatically.

12. The apparatus as claimed in claim 11, wherein the determining device comprises the control device.

13. The apparatus as claimed in claim 11, wherein the control device is designed to automatically control the power source and the detecting device.

14. The apparatus as claimed in claim 9, wherein the apparatus is designed to be portable.

\* \* \* \* \*